(12) United States Patent
Shigeta et al.

(10) Patent No.: US 10,714,402 B2
(45) Date of Patent: Jul. 14, 2020

(54) SEMICONDUCTOR CHIP PACKAGE FOR IMPROVING FREEDOM OF ARRANGEMENT OF EXTERNAL TERMINALS

(71) Applicant: SONY CORPORATION, Tokyo (JP)

(72) Inventors: Hiroyuki Shigeta, Kanagawa (JP); Yuuji Nishitani, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/307,183

(22) PCT Filed: May 16, 2017

(86) PCT No.: PCT/JP2017/018335
§ 371 (c)(1),
(2) Date: Dec. 5, 2018

(87) PCT Pub. No.: WO2017/221589
PCT Pub. Date: Dec. 28, 2017

(65) Prior Publication Data
US 2019/0139843 A1 May 9, 2019

(30) Foreign Application Priority Data
Jun. 20, 2016 (JP) .................. 2016-121316

(51) Int. Cl.
*H01L 23/15* (2006.01)
*H01L 23/14* (2006.01)
(Continued)

(52) U.S. Cl.
CPC ............. *H01L 23/15* (2013.01); *H01L 23/12* (2013.01); *H01L 23/142* (2013.01); *H01L 24/14* (2013.01);
(Continued)

(58) Field of Classification Search
CPC ....... H01L 23/15; H01L 27/148; H01L 24/16; H01L 23/142; H01L 2224/16225;
(Continued)

(56) References Cited

U.S. PATENT DOCUMENTS

2006/0065964 A1* 3/2006 Ohsumi ................. H01L 21/56
257/690
2006/0171698 A1* 8/2006 Ryu ................. H01L 27/14618
396/114
(Continued)

FOREIGN PATENT DOCUMENTS

CN 102403325 A 4/2012
CN 103915393 A 7/2014
(Continued)

OTHER PUBLICATIONS

International Search Report and Written Opinion of PCT Application No. PCT/JP2017/018335, dated Jun. 20, 2017, 02 pages of translation and 10 pages of ISRWO.

*Primary Examiner* — Alexander O Williams
(74) *Attorney, Agent, or Firm* — Chip Law Group

(57) ABSTRACT

This semiconductor chip package has opposed first surface and second surface, and includes a semiconductor chip having a circuit part and an electrode for supplying a voltage to the circuit part, a resin layer formed in a periphery of the semiconductor chip, a substrate that is disposed to face the first surface of the semiconductor chip and the resin layer, and a plurality of external terminals that are provided on the second surface of the semiconductor chip, each of the plurality of external terminals being electrically coupled to any of the plurality of electrodes.

12 Claims, 11 Drawing Sheets

(51) Int. Cl.
*H01L 23/00* (2006.01)
*H01L 27/148* (2006.01)
*H04N 5/374* (2011.01)
*H01L 27/146* (2006.01)
*H01L 23/12* (2006.01)
*H04N 5/369* (2011.01)

(52) U.S. Cl.
CPC .............. *H01L 24/16* (2013.01); *H01L 24/17* (2013.01); *H01L 24/19* (2013.01); *H01L 24/20* (2013.01); *H01L 24/32* (2013.01); *H01L 24/97* (2013.01); *H01L 27/148* (2013.01); *H01L 27/14618* (2013.01); *H01L 27/14636* (2013.01); *H04N 5/369* (2013.01); *H04N 5/374* (2013.01); *H01L 24/13* (2013.01); *H01L 24/81* (2013.01); *H01L 2224/13101* (2013.01); *H01L 2224/14135* (2013.01); *H01L 2224/14181* (2013.01); *H01L 2224/16225* (2013.01); *H01L 2224/73253* (2013.01); *H01L 2224/81951* (2013.01); *H01L 2224/97* (2013.01); *H01L 2924/15173* (2013.01); *H01L 2924/15321* (2013.01); *H01L 2924/16235* (2013.01); *H01L 2924/18161* (2013.01)

(58) Field of Classification Search
CPC .............. H01L 23/12; H01L 27/14618; H01L 27/14636; H01L 23/481; H01L 24/14; H01L 24/17; H01L 2224/97; H01L 2224/81951; H01L 24/13; H01L 24/81; H01L 24/97; H01L 2224/13101; H01L 2924/15321; H01L 2924/18161; H01L 2224/14135; H01L 2924/014; H01L 2924/00014; H01L 2224/14181; H01L 23/00; H01L 23/14; H01L 23/27148; H04N 5/374; H04N 5/369
USPC .......................... 257/774, 773, 737, 738, 778
See application file for complete search history.

(56) References Cited

U.S. PATENT DOCUMENTS

| | | | | |
|---|---|---|---|---|
| 2008/0211045 | A1* | 9/2008 | Ono | H01L 27/14618 257/432 |
| 2010/0295178 | A1* | 11/2010 | Ishihara | H01L 21/6835 257/737 |
| 2011/0204487 | A1* | 8/2011 | Nakano | H01L 23/3114 257/621 |
| 2012/0056292 | A1* | 3/2012 | Suzuki | H01L 27/14618 257/432 |
| 2013/0026632 | A1* | 1/2013 | Kikuchi | H01L 21/6835 257/753 |
| 2014/0183591 | A1* | 7/2014 | Jow | H01L 27/14618 257/99 |
| 2015/0087086 | A1* | 3/2015 | Yoshida | H01L 25/042 438/14 |
| 2015/0255500 | A1* | 9/2015 | Akahoshi | H01L 27/14618 257/434 |
| 2015/0270457 | A1 | 9/2015 | Jow et al. | |
| 2015/0333037 | A1* | 11/2015 | Yoshida | H01L 25/042 257/433 |
| 2019/0103426 | A1* | 4/2019 | Tanaka | H01L 27/14605 |
| 2019/0139843 | A1* | 5/2019 | Shigeta | H04N 5/374 |

FOREIGN PATENT DOCUMENTS

| | | |
|---|---|---|
| CN | 104364898 A | 2/2015 |
| EP | 1686628 A2 | 8/2006 |
| EP | 2239773 A1 | 10/2010 |
| EP | 2858106 A1 | 4/2015 |
| JP | 2006-128625 A | 5/2006 |
| JP | 2006-216935 A | 8/2006 |
| JP | 2007-53395 A | 3/2007 |
| JP | 2007-053395 A | 3/2007 |
| JP | 2009-010352 A | 1/2009 |
| JP | 2009-182208 A | 8/2009 |
| JP | 2012-059832 A | 3/2012 |
| JP | 2012-59832 A | 3/2012 |
| JP | 2016-27586 A | 2/2016 |
| JP | 2016-027586 A | 2/2016 |
| KR | 10-2006-0088189 A | 8/2006 |
| KR | 10-2010-0089894 A | 8/2010 |
| KR | 10-2012-0025409 A | 3/2012 |
| TW | 201220463 A | 5/2012 |
| TW | 201426985 A | 7/2014 |
| WO | 2009/096240 A1 | 8/2009 |
| WO | 2013/179767 A1 | 12/2013 |
| WO | 2014/083746 A1 | 6/2014 |
| WO | 2014/083750 A1 | 6/2014 |

* cited by examiner

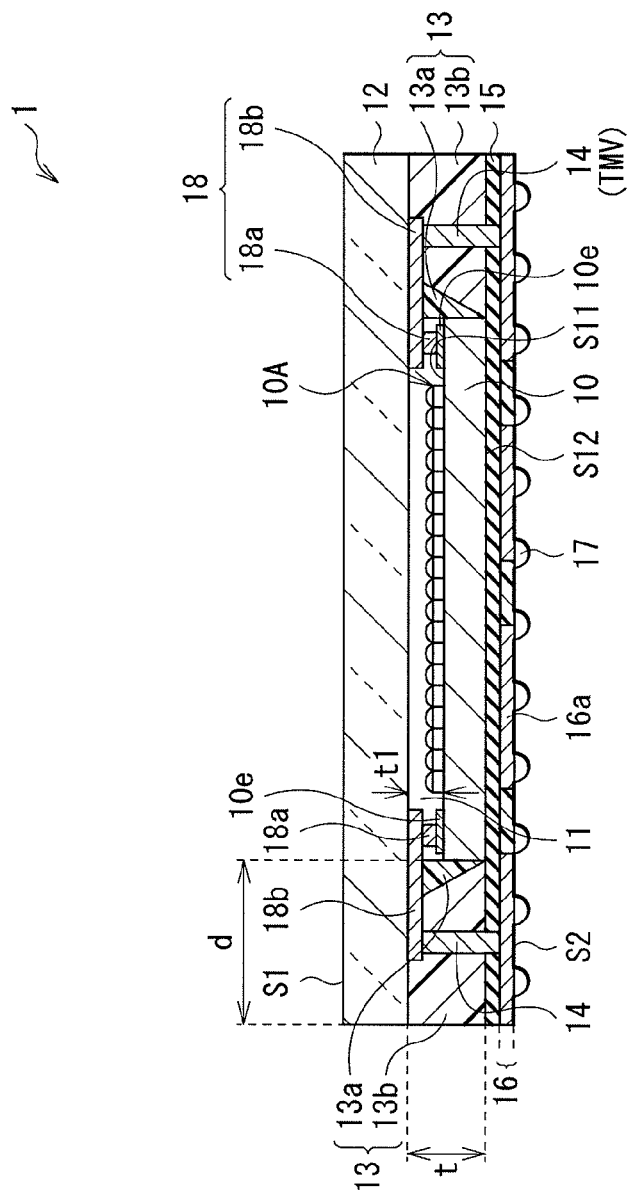
[FIG. 1]

[FIG. 2]
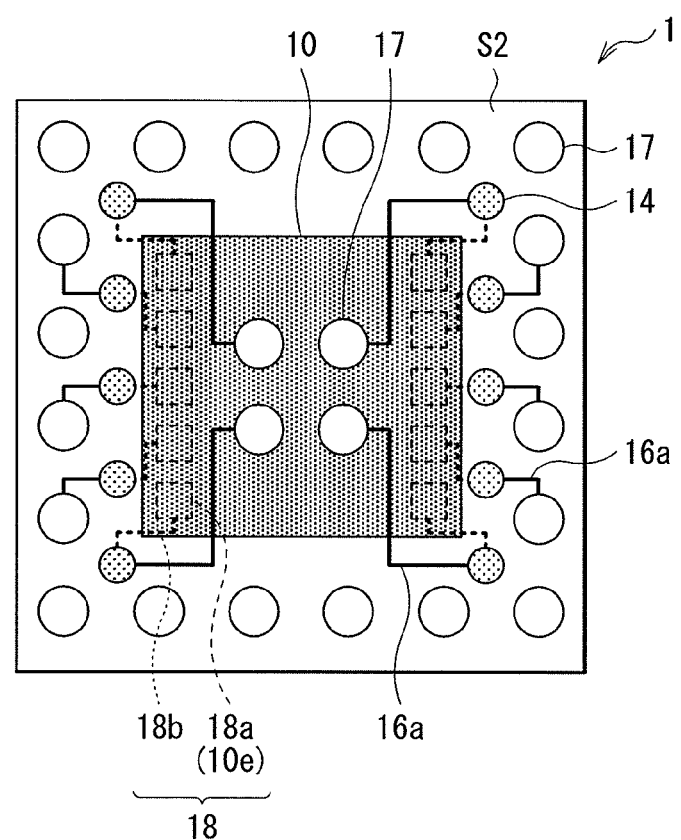

[FIG. 3]
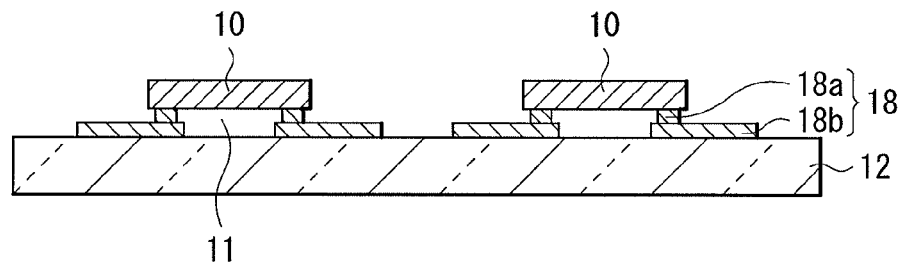
[FIG. 4A]
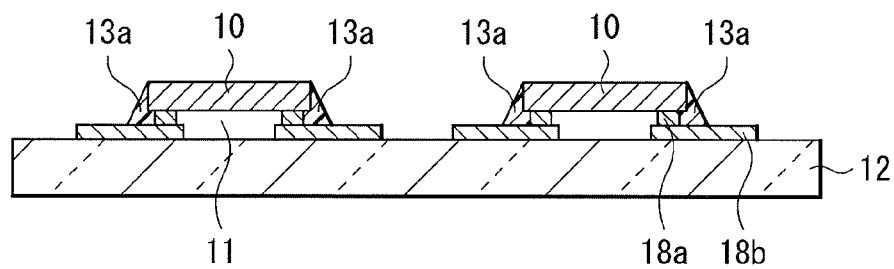
[FIG. 4B]
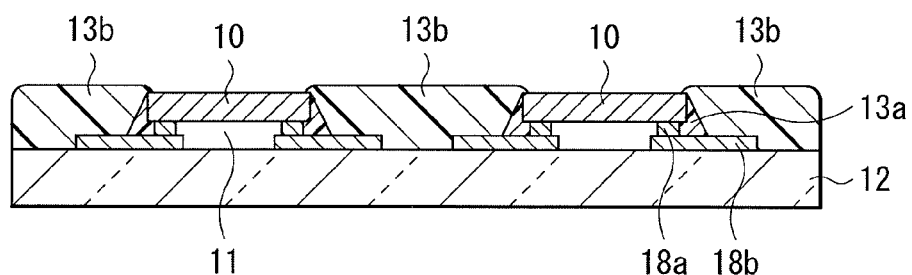
[FIG. 4C]
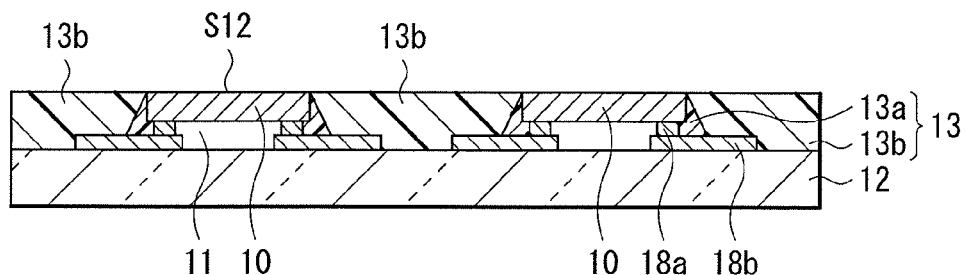

[ FIG. 5 ]
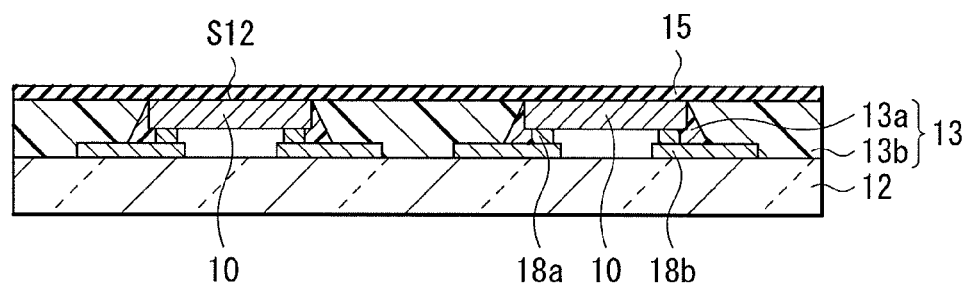
[ FIG. 6 ]
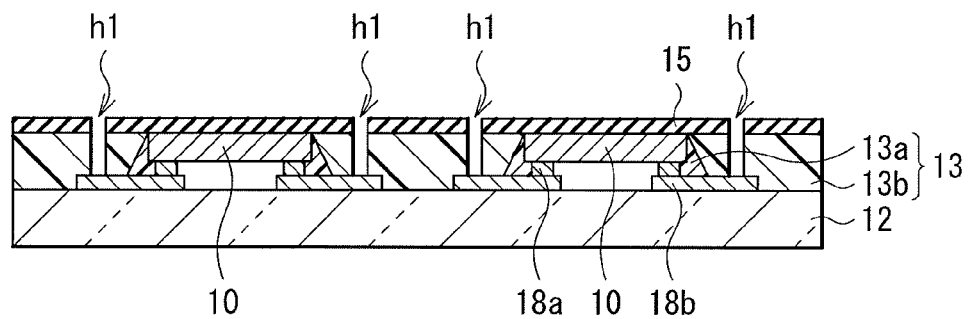
[ FIG. 7 ]
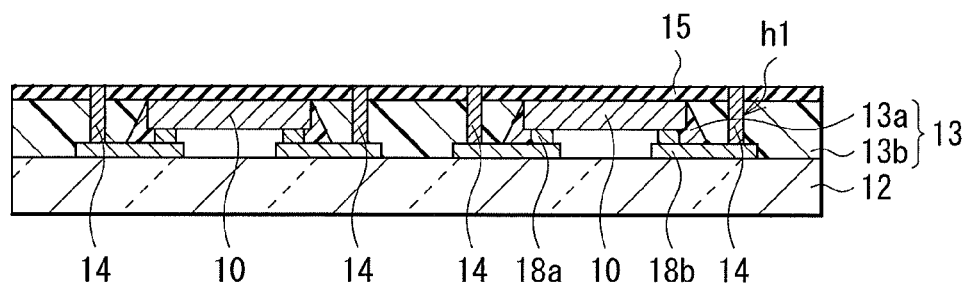

[ FIG. 8 ]
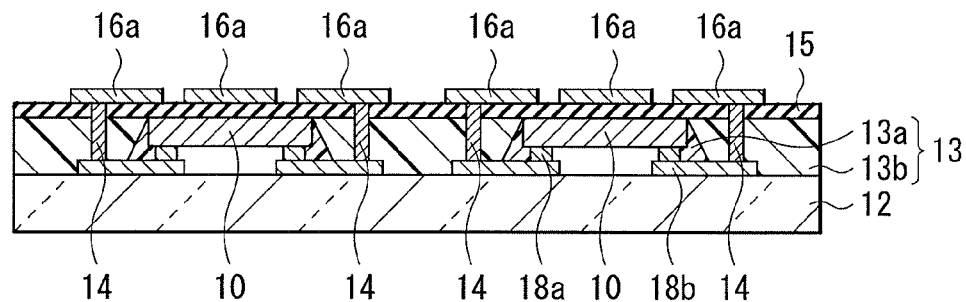
[ FIG. 9 ]
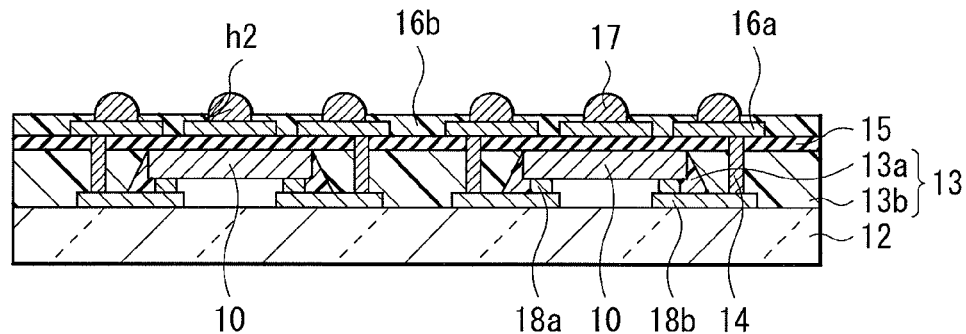
[ FIG. 10 ]
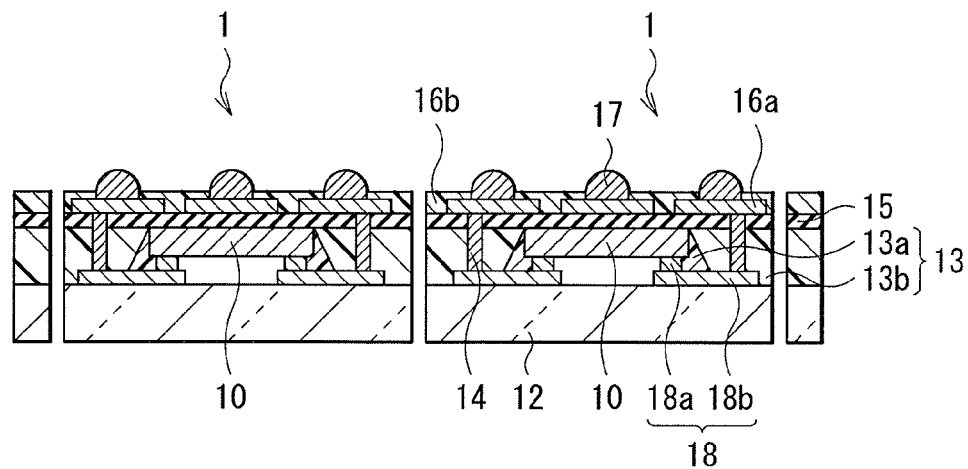

[ FIG. 11 ]
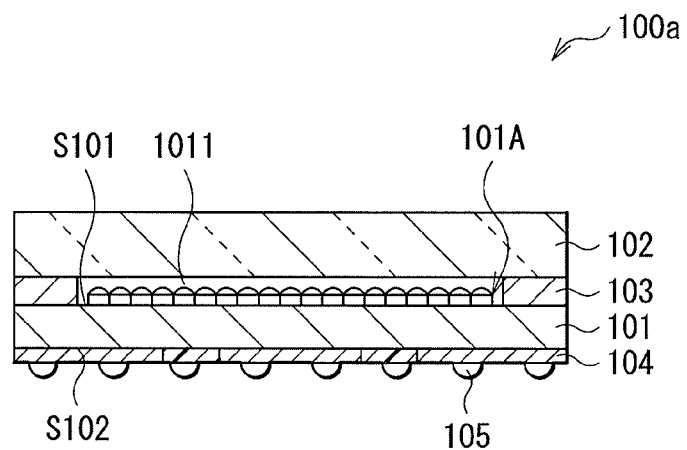
[ FIG. 12 ]
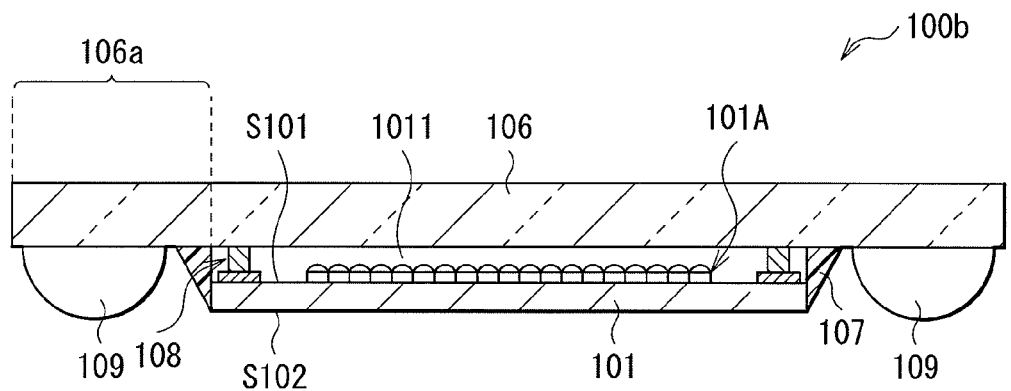

[FIG. 13]
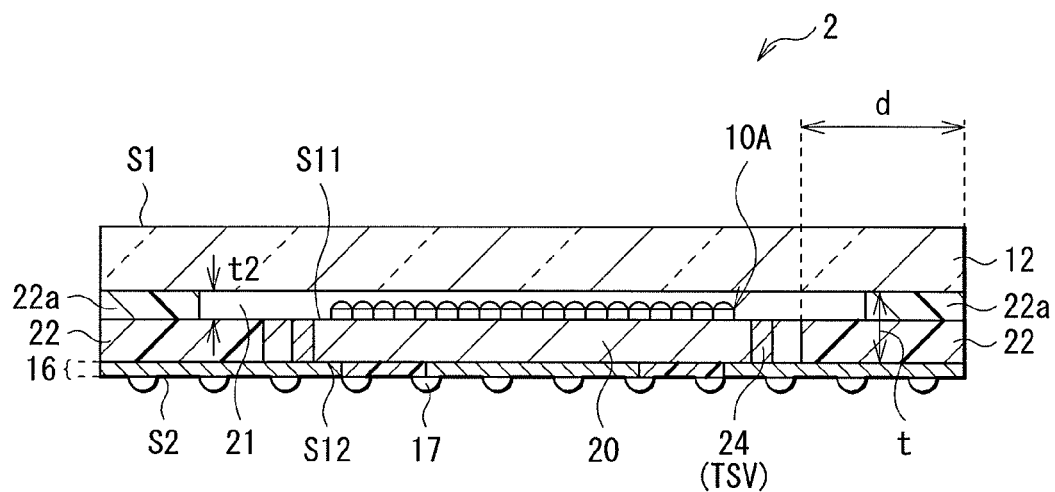
[FIG. 14]
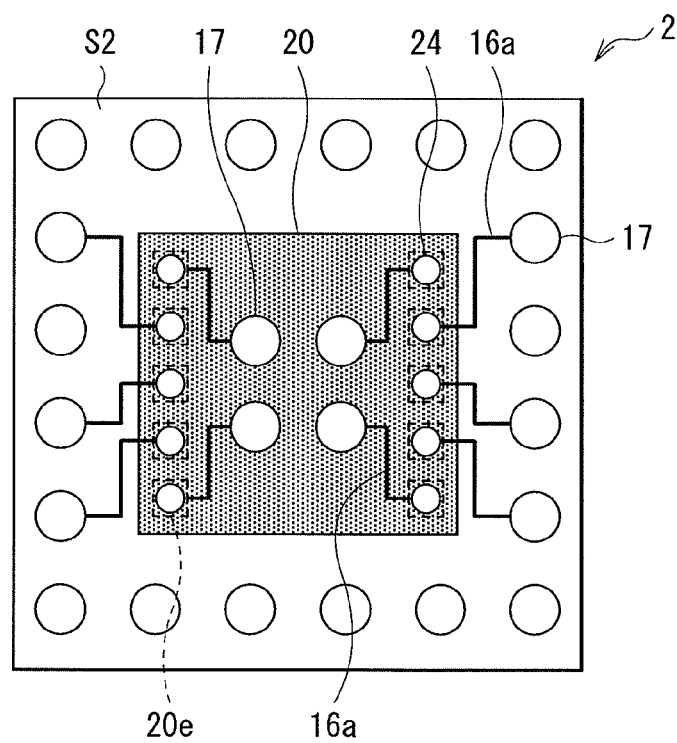

[ FIG. 15 ]
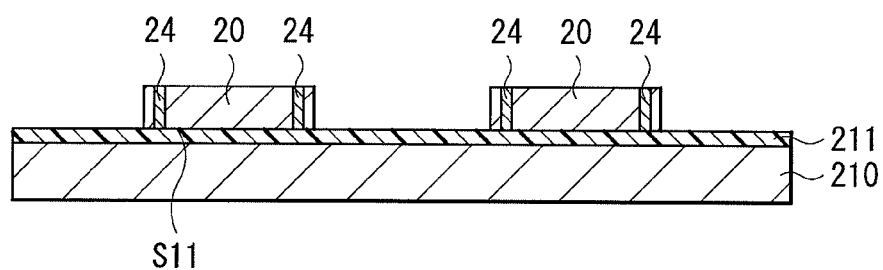
[ FIG. 16A ]
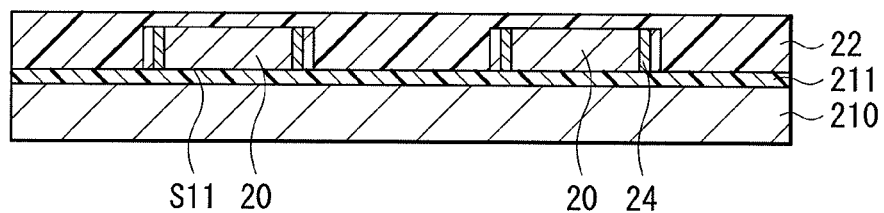
[ FIG. 16B ]
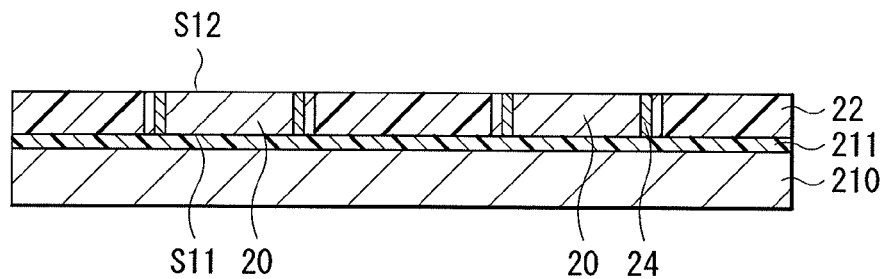

[ FIG. 17 ]
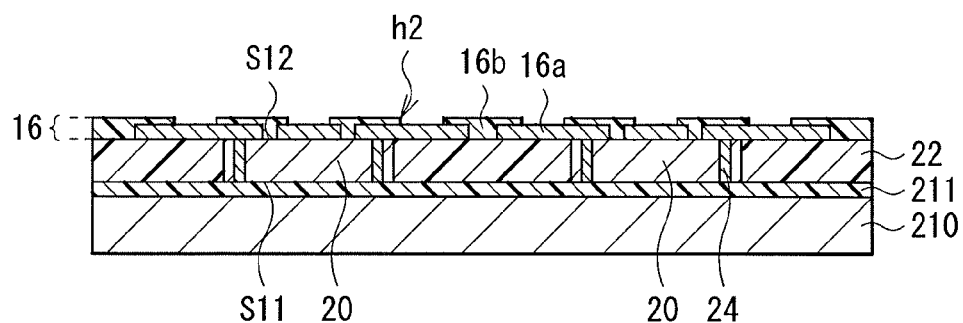
[ FIG. 18 ]
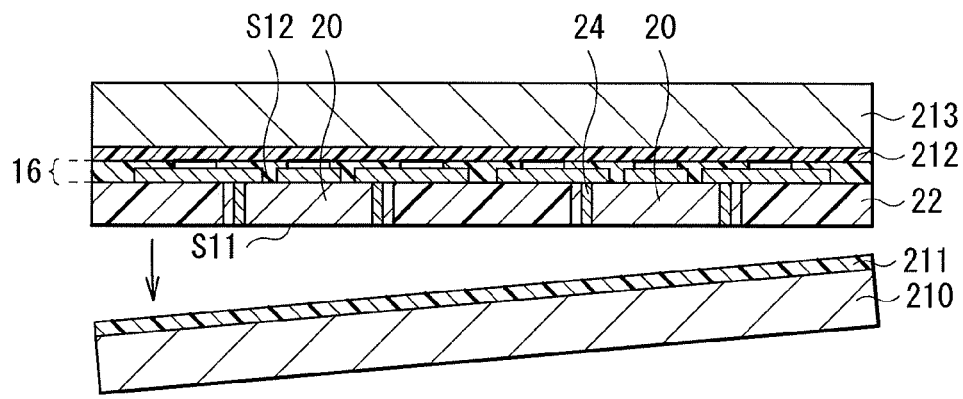
[ FIG. 19 ]
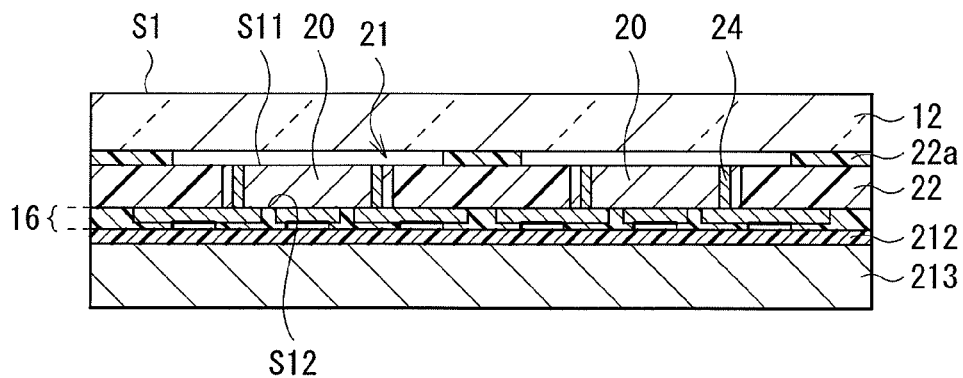

[FIG. 20]
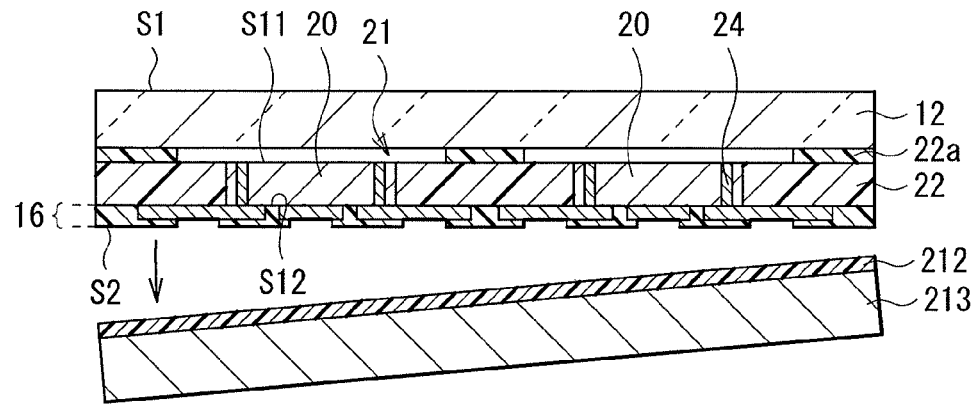
[FIG. 21]
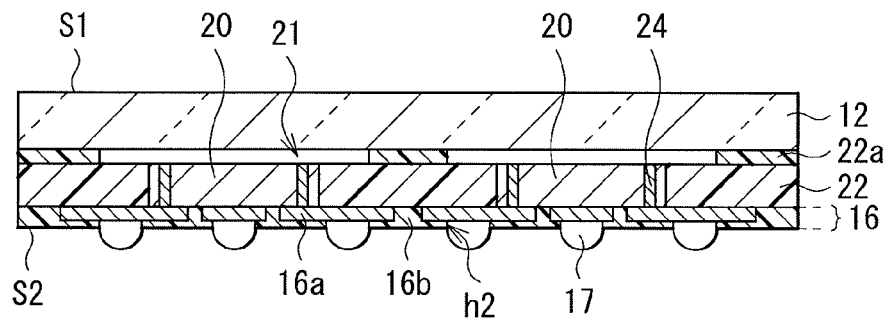
[FIG. 22]
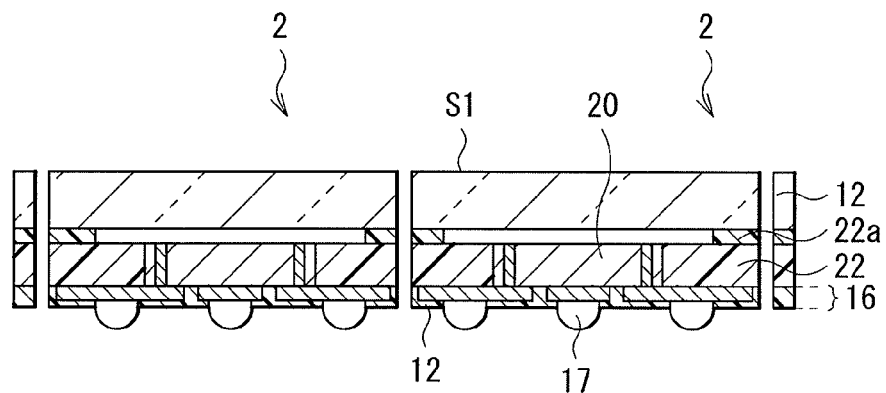

[ FIG. 23 ]
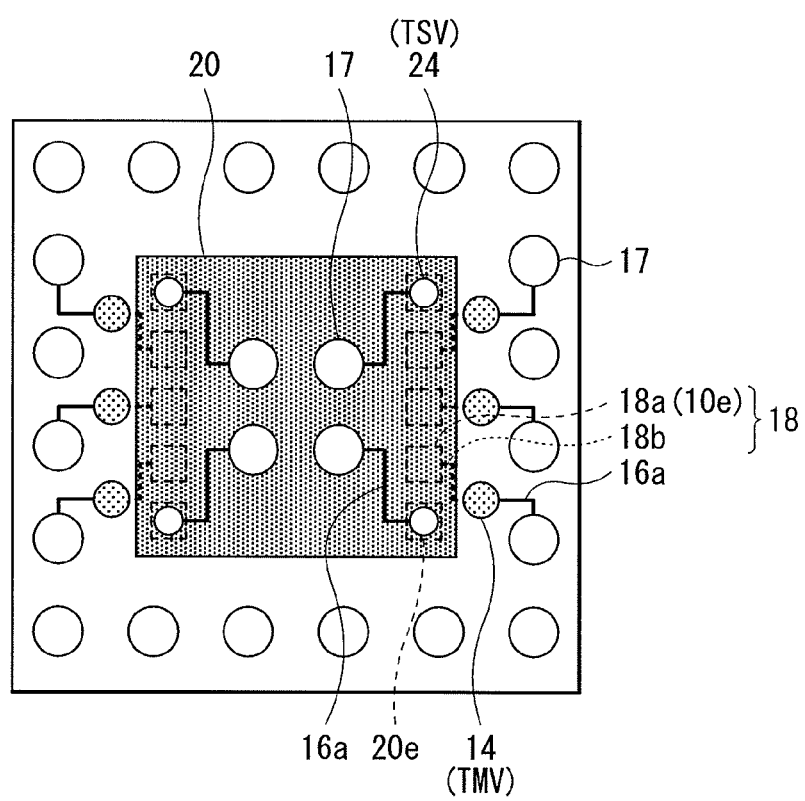

SEMICONDUCTOR CHIP PACKAGE FOR IMPROVING FREEDOM OF ARRANGEMENT OF EXTERNAL TERMINALS

CROSS REFERENCE TO RELATED APPLICATIONS

This application is a U.S. National Phase of International Patent Application No. PCT/JP2017/018335 filed on May 16, 2017, which claims priority benefit of Japanese Patent Application No. JP 2016-121316 filed in the Japan Patent Office on Jun. 20, 2016. Each of the above-referenced applications is hereby incorporated herein by reference in its entirety.

TECHNICAL FIELD

The present disclosure relates to a semiconductor chip package including an external terminal.

BACKGROUND ART

In recent years, as a semiconductor chip package that is advantageous in downsizing of an electronic apparatus, development of a chip size package (CSP: Chip size package) or a wafer level package (WLP: wafer Level Package), for example, has been under way (PTLs 1 and 2, for example).

CITATION LIST

Patent Literature

PTL 1: Japanese Unexamined Patent Application Publication No. 2009-10352
PTL 2: Japanese Unexamined Patent Application Publication No. JP2009-182208

SUMMARY OF THE INVENTION

In the semiconductor chip package as described above, it is desirable to realize a package structure that is able to improve freedom of arrangement of external terminals, while realizing downsizing.

A semiconductor chip package according to an embodiment of the present disclosure includes a semiconductor chip that has opposed first surface and second surface, and has a circuit part and electrodes for supplying a voltage to the circuit part, a resin layer formed in a periphery of the semiconductor chip, a substrate that is disposed to face the first surface of the semiconductor chip and the resin layer, and has optical transparency, and a plurality of external terminals provided on side of the second surface of the semiconductor chip, each of the plurality of external terminals being electrically coupled to any of the plurality of electrodes.

In the semiconductor chip package according to the embodiment of the present disclosure, the resin layer is formed in the periphery of the semiconductor chip and the electrode of the semiconductor chip is electrically coupled to the external terminal formed on the side of the second surface. This allows for formation of the external terminal in both a region corresponding to the semiconductor chip and a region corresponding to the resin layer, on the side of the second surface of the semiconductor chip.

In the semiconductor chip package according to the embodiment of the present disclosure, the resin layer is formed in the periphery of the semiconductor chip and the electrode of the semiconductor chip is electrically coupled to the external terminal formed on the side of the second surface. This allows for the formation of the external terminal in both the region corresponding to the semiconductor chip and the region corresponding to the resin layer, on the side of the second surface of the semiconductor chip. It is possible to make package size smaller than the package structure in which the external terminal is arranged only in a region corresponding to the periphery of the semiconductor chip. In addition, the freedom of arrangement of the external terminals becomes higher than the package structure in which the external terminal is arranged only in a region corresponding to the semiconductor chip (a region located inside more than a perimeter of the semiconductor chip). Therefore, it is possible to improve the freedom of arrangement of the external terminals, while realizing downsizing.

It is to be noted that the above description is an example of the present disclosure. The effects of the disclosure are not limited to those described above, and may be other different effects or may further have other effects.

BRIEF DESCRIPTION OF DRAWINGS

FIG. 1 is a cross-sectional view of a configuration of a sensor chip package of a first embodiment of the present disclosure.
FIG. 2 is a schematic plan view describing an example of a wiring connection configuration of the sensor chip package illustrated in FIG. 1.
FIG. 3 is a cross-sectional view describing a process of a manufacturing method of the sensor chip package illustrated in FIG. 1.
FIG. 4A is a cross-sectional view describing a process following FIG. 3.
FIG. 4B is a plan view corresponding to the process of FIG. 4A.
FIG. 4C is a plan view corresponding to the process of FIG. 4B.
FIG. 5 is a cross-sectional view describing a process following FIG. 4C.
FIG. 6 is a cross-sectional view describing a process following FIG. 5.
FIG. 7 is a cross-sectional view describing a process following FIG. 6.
FIG. 8 is a cross-sectional view describing a process following FIG. 7.
FIG. 9 is a cross-sectional view describing a process following FIG. 8.
FIG. 10 is a cross-sectional view describing a process following FIG. 9.
FIG. 11 is a cross-sectional view of a configuration of a sensor chip package according to Comparative Example 1.
FIG. 12 is a cross-sectional view of a configuration of a sensor chip package according to Comparative Example 2.
FIG. 13 is a cross-sectional view of a configuration of a sensor chip package according to a second embodiment of the present disclosure.
FIG. 14 is a schematic plan view describing an example of a wiring connection configuration of the sensor chip package illustrated in FIG. 13.
FIG. 15 is a cross-sectional view describing a process of a manufacturing method of the sensor chip package illustrated in FIG. 13.

FIG. 16A is a cross-sectional view describing a process following FIG. 15.

FIG. 16B is a plan view corresponding to the process of FIG. 16A.

FIG. 17 is a cross-sectional view describing a process following FIG. 16B.

FIG. 18 is a cross-sectional view describing a process following FIG. 17.

FIG. 19 is a cross-sectional view describing a process following FIG. 18.

FIG. 20 is a cross-sectional view describing a process following FIG. 19.

FIG. 21 is a cross-sectional view describing a process following FIG. 20.

FIG. 22 is a cross-sectional view describing a process following FIG. 21.

FIG. 23 is a schematic plan view of an example of a wiring connection configuration of a sensor chip package according to a modification example.

MODES FOR CARRYING OUT THE INVENTION

In the following, some embodiments of the disclosure are described in detail with reference to the drawings. It is to be noted that the description is given in the following order.
1. First Embodiment (An example of a chip package in which a through-electrode is formed in a resin layer in a periphery of a sensor chip, and the sensor chip is electrically coupled to an external terminal via the through-electrode)
2. Second Embodiment (An example of the chip package in which the resin layer is formed in the periphery of the sensor chip and the through-electrode is formed in the sensor chip, and the sensor chip is electrically coupled to the external terminal via the through-electrode)
3. Modification Example (An example of a case where coupling with the external terminal is performed through the use of both the through-electrode of the resin layer and the through-electrode of the sensor chip)

First Embodiment

[Configuration]

FIG. 1 illustrates a cross-sectional configuration of a semiconductor chip package (sensor chip package 1) of a first embodiment of the present disclosure. The sensor chip package 1 is an electronic component called a chip size package (CSP) or a wafer level package (WLP), for example, and includes a sensor chip 10 (semiconductor chip), for example. A resin layer 13 is formed in a periphery of the sensor chip 10 (the periphery of the sensor chip 10 is sealed by the resin layer 13). A substrate 12 is disposed to face one surface of the semiconductor chip 10 (surface on a light-incident side, surface S11, for example) and the resin layer 13. On side of a surface S12 facing the surface S11 of the sensor chip 10 are provided an insulating film 15, a rewiring layer (Re-Distribution Layer: RDL) 16, and a plurality of terminals for external coupling (external terminals 17).

The sensor chip 10 includes an imaging device (light receiving device) such as a CCD (Charge Coupled Device Image Sensor) and a CMOS (Complementary Metal Oxide Semiconductor) image sensor, for example. In the sensor chip 10, a plurality of circuits (circuit parts) including transistors are formed, for example, on a silicon substrate by a microfabrication process and various functions are integrated. A light receiving part 10A including a color filter and an on-chip lens, etc., for example, is formed on the surface S11 of the sensor chip 10. In this embodiment, the sensor chip 10 includes, on the surface S11, a plurality of electrodes 10e that are electrically coupled to the circuit part as mentioned above and intended for supplying a voltage to the circuit part.

A gap (cavity 11) is provided between the surface S11 of the sensor chip 10 and the substrate 12. In other words, the sensor chip 10 and the substrate 12 are spaced apart and disposed to face each other. A thickness t1 of the cavity 11 (distance between the surface S11 of the sensor chip 10 and the substrate 12) is not particularly limited, but it is desirable that size be secured that does not damage the light receiving part 10A (on-chip lens, in particular) of the sensor chip 10. A protective film may be formed on the light receiving part 10A, as appropriate.

The substrate 12 includes a material having light transparency. It is desirable that the substrate 12 include a transparent substrate having sealing performance, such as a glass substrate, for example. This is because light enters the sensor chip 10 from side of a top surface (surface S1) of the substrate 12, and the substrate 12 and the resin layer 13 seal the sensor chip 10.

It is possible that the resin layer 13 include a curing agent which contains a novolak resin and a phenol resin, for example, with an epoxy resin as a base resin, and a thermosetting resin to which a filler such as spherical silica is added. In addition to this, the resin layer 13 may include a reaction accelerator, a silane coupling agent, a flame retardant, for example, as appropriate. Although a thickness t of the resin layer 13 is not particularly limited, the thickness t is appropriately set in accordance with a thickness of the sensor chip 10, the thickness t1 of the cavity 11, and viscosity of a material included in the resin layer 13, for example. Although a width d of the resin layer 13 is not particularly limited, the width d is appropriately set in accordance with size of the sensor chip package 1 and a layout of the external terminal 17, for example.

The resin layer 13 has a side-fill resin 13a (first resin layer) covering a portion or all of a side surface of the sensor chip 10, for example. More specifically, the side-fill resin 13a is formed to cover at least a region close to a wiring part 18 of the side surface of the sensor chip 10 in a cross section. In a planar view, the side-fill resin 13a is formed to surround a profile of the sensor chip 10, for example, and, in a case where a planar shape of the sensor chip 10 is of a rectangular shape, for example, the side-fill resin 13a is formed along each side of the rectangular shape. The resin layer 13 also has an embedding resin 13b (second resin layer) that covers the side-fill resin 13a to seal the periphery of the sensor chip 10. A material (viscosity) of the side-fill resin 13a and the embedding resin 13b may be same or different. Although the resin layer 13 may be formed in the periphery of the sensor chip 10 in one process, it is desirable that the resin layer 13 be formed in later-described two processes (a forming process of the side-fill resin 13a and the forming process of the embedding resin 13b). The side-fill resin 13a suppresses adhesion of a resin material to the light receiving part 10A. Therefore, it is desirable that a material of relatively high viscosity be used. In contrast, it is desirable that a material of relatively low viscosity be used for the embedding resin 13b. This is because it is possible to make embedding time shorter than a case where the material of high viscosity is used, and to suppress a decrease in productivity.

It is desirable that a surface of the resin layer 13 opposite to the substrate 12 and the surface S12 of the sensor chip 10 make a single plane (be flat), for example. This is because flatness of a surface S2 of the sensor chip package 1 improves, thus making it possible to form, with good precision, the rewiring layer 16 and the external terminal 17 across an entire region of the surface S2. This makes it possible to flexibly cope with an increase in the number of terminals in a flip chip connection (multiplication of pins) and miniaturization, for example.

In the sensor chip package 1 as described above, the substrate 12 is disposed to face the surface S11 of the sensor chip 10, and the resin layer 13 is formed in the periphery of the sensor chip 10. In such a configuration, the electrode 10e on the surface S11 of the sensor chip 10 and the external terminal 17 on the side of the surface S12 are electrically coupled. In the following, an example of a wiring route to electrically couple the electrode 10e and the external terminal 17 is described.

(Wiring Connection Configuration)

FIG. 2 illustrates an example of a wiring connection configuration (wiring route) between the sensor chip 10 (electrode 10e, in particular) and the external terminal 17. It is to be noted that FIG. 2 assumes a planar configuration of a case where the sensor chip package 1 is viewed from side of the surface S2. As illustrated in FIG. 1 and FIG. 2, in this embodiment, the wiring part 18 electrically coupled to the electrode 10e is formed on the side of the surface S11 of the sensor chip 10. In addition, a through-electrode 14 is formed on the resin layer 13. In this configuration, as schematically illustrated in FIG. 2, the electrode 10e of the sensor chip 10 and the external terminal 17 are electrically coupled through, for example, the wiring part 18, the through-electrodes 14, and the rewiring layer 16 (rewiring 16a). In this example, the external terminals 17 are arranged on both of a region corresponding to the sensor chip 10 and a region corresponding to the resin layer 13 (peripheral region of the sensor chip 10).

The wiring part 18 has a coupling part 18a and a wiring layer 18b, for example. The wiring part 18 is provided in every electrode 10e, for example. The wiring part 18a is electrically coupled to the electrode 10e of the sensor chip 10. The coupling part 18a is a solder bump, etc., for example, and intended for coupling the sensor chip 10 to the wiring layer 18b by flip-chip bonding. The wiring layer 18b is provided between the substrate 12 and the resin layer 13. One end (or one portion) of the wiring layer 18b is electrically coupled to the coupling part 18a, and other end (or the other portion) is electrically coupled to the through-electrode 14. It is to be noted that the coupling part 18a and the wiring layer 18b which configure the wiring part 18 are illustrated in a dashed line in FIG. 2.

The through-electrode 14 is a mold through-electrode (TMV: Through Mold Via) which is formed by penetrating the resin layer 13. For example, the plurality of through-electrodes 14 are provided. One end of the through-electrode 14 is electrically coupled to one or two or more wiring parts 18 (wiring layer 18b, in particular). In this example, the through-electrode 14 is so formed as to be in contact with the wiring layer 18b. The other end of the through-electrode 14 is electrically coupled to any of the plurality of external terminals 17. In this example, an insulating film 15 is so formed as to cover the surface S12 of the sensor chip 10 and the surface of the resin layer 13 opposite to the substrate 12. The through-electrode 14 is so formed as to penetrate the resin layer 13 and the insulating film 15. It is possible to form the through-electrode 14 by embedding copper (Cu), for example, into a through-hole (through-hole) formed in the resin layer 13, for example, by plating.

The external terminal 17 is a terminal intended for coupling to a mounting substrate by the flip-chip bonding, for example, and two-dimensionally arranged on the surface S2 of the sensor chip package 1. The external terminal 17 includes the solder bump containing nickel (Ni) and gold (Au), etc., for example. As described above, although it is possible to form the external terminal 17 across the entire region of the surface S2 corresponding to the sensor chip 10 and the resin layer 13, the external terminal 17 is desirably so formed as to bypass a region facing the through-electrode 14 (formed in a region shifted from the region facing the through-electrode 14). This is because, in the region facing the through-electrode 14, the rewiring 16a is easily formed concavely, and thus, in a case where the external terminal 17 is formed thereon, a height of the external terminal 17 fluctuates or poor coupling occurs.

The rewiring layer 16 includes the rewiring 16a to electrically couple the through-electrode 14 and the external terminal 17 on the side of the surface S2 of the sensor chip package. The rewiring 16a includes at least one of copper, gold, or the like, for example. In the rewiring layer 16, a solder resist 16b (described later) having an opening, for example, is formed on the rewiring 16a. The external terminal 17 is formed at the opening of the solder resist 16b.

It is to be noted that the example depicted in FIG. 2 illustrates a configuration in which one electrode 10e of the sensor chip 10 is coupled to one external terminal 17 through one through-electrode 14; however, the electrode 10e, the through-electrode 14, and the external terminal 17 may be coupled to each other by any coupling other than such a one-to-one coupling. That is, the two or more electrodes 10e may be coupled to the one through-electrode 14. Moreover, the two or more through-electrodes 14 may be coupled to the one external terminal 17. With such a configuration, in a case where a plurality of electrodes 10e are arranged to supply a ground potential or a power source to each circuit of the sensor chip 10, for example, it is possible to share the wiring route including such electrodes 10e. It is possible to reduce the number of the through-electrodes 14 and the number of the external terminals 17 without modifying the functions integrated into the sensor chip 10. In other words, the sharing of the wiring route generates a redundant space on the surface S2, thus making it possible to increase the number of devices to be formed on the sensor chip 10 and cope with further multifunctionality.

[Manufacturing Method]

It is possible to manufacture the aforementioned sensor chip package 1 in the following manner, for example. FIGS. 3, 4A, 4B, 4C, 5, 6, 7, 8, 9, and 10 sequentially illustrate manufacturing processes of the sensor chip package 1. It is to be noted that in FIGS. 3, 4A, 4B, 4C, 5, 6, 7, 8, 9, and 10, for simplicity, illustration of some components of those illustrated in FIG. 1 is omitted.

First, as illustrated in FIG. 3, the sensor chip 10 having the coupling part 18a is, for example, flip-chip bonded onto the substrate 12 on which the wiring layer 18b is formed. This electrically couples the substrate 12 and the sensor chips 10 via the wiring part 18. It is to be noted that in this embodiment, a glass wafer, for example, is used as the substrate 12, and the plurality of sensor chips 10 are mounted on the glass wafer.

Thereafter, the side-fill resin 13a is formed, as illustrated in FIG. 4A. Specifically, a thermosetting resin including the aforementioned material is applied to cover a portion or all of the side surface of each of the sensor chips 10 and thermally set. As the side-fill resin 13a, a material that has viscosity equivalent to or higher than a general underfill resin is usable. Moreover, this forms the cavity 11 between the sensor chip 10 and the substrate 12, thus making it possible to protect the light-receiving part 10A (not illustrated in FIG. 4A) of the sensor chip 10.

Next, the embedding resin 13B is formed, as illustrated in FIG. 4B. Specifically, the thermosetting resin including the aforementioned material is so applied and thermally set as to cover the side-fill resin 13a and to fill regions between the respective sensor chips 10.

Afterward, a grinding process is performed on the surface of the formed embedding resin 13b and the surface of the sensor chip 10, as illustrated in FIG. 4C. At this time, only a convex portion of the embedding resin 13b (a portion protruding from the surface of the sensor chip 10) may be selectively removed or a portion of the sensor chip 10 (a portion of a silicon substrate), for example, may be removed together with the embedding resin 13b. The surface of the sensor chip 10 after having subjected to the grinding process corresponds to the aforementioned surface S12. It is possible to form the resin layer 13 in this manner. Moreover, the grinding process allows the surface of the resin layer 13 opposite to the substrate 12 and the surface S12 of the sensor chip 10 to be planarized to make a single plane.

Thereafter, the insulating film 15 is formed on the sensor chip 10 and the resin layer 13, as illustrated in FIG. 5.

Next, a through-hole h1 penetrating the insulating film 15 and the resin layer 13 is formed on a region facing the wiring layer 18b, as illustrated in FIG. 6. At this time, with use of photolithography and etching, for example, a selective region of the insulating film 15 and the resin layer 13 is removed to reach a surface of the wiring layer 18b.

Afterward, copper, for example, is embedded into the through-hole h1 by plating to form the through-electrode 14, as illustrated in FIG. 7.

Thereafter, the rewiring layer 16 is formed. Specifically, first, the rewiring 16a is formed, as illustrated in FIG. 8. At this time, the rewiring 16a is formed by forming a metal film including the aforementioned material on the insulating film 15 and then processing the metal film by the photolithography and the etching, for example. Thereafter, the solder resist 16b is formed, as illustrated in FIG. 9. Specifically, a resist material having heat resistance, for example, is applied to cover the rewiring 16a. Then, the solder resist 16b is patterned, after having subjected to respective processes of drying, exposure, and development, for example. This opens a region where the external terminal 17 is formed on the rewiring 16a (forming an opening h2), and allows for insulation protection of any region other than the region. The rewiring layer 16 is formed in this manner. Afterward, the external terminal 17 such as the solder bump, for example, is formed at the opening h2 of the rewiring layer 16.

Lastly, separation (dicing) is performed, as illustrated in FIG. 10. This completes the sensor chip package 1 as illustrated in FIG. 1.

[Workings and Effects]

In the sensor chip package 1 of this embodiment, the resin layer 13 is formed in the periphery of the sensor chip 10, and the electrode 10e on the surface S11 of the sensor chip 10 is electrically coupled to the external terminal 17 formed on the side of the surface S12. This allows for formation of the external terminal 17 in both the region corresponding to the sensor chip 10 and the region corresponding to the resin layer 13 on the side of the surface S12 of the sensor chip 10 (on the side of the surface S2 of the sensor chip package 1).

Here, FIG. 11 illustrates a cross-sectional configuration of a sensor chip package 100a according to a comparative example (Comparative Example 1) of embodiment. The sensor chip package 100a of this Comparative Example 1 includes a light receiving part 101A on a surface S101 of a sensor chip 101, and has a substrate 102 facing the sensor chip 101 via a cavity 101l. A sealing layer 103 is formed in a peripheral region of the cavity 101l. An unillustrated silicon through-electrode (TSV: Through-Silicon Via) is formed in the sensor chip 101.

The sensor chip package 100a of Comparative Example 1 is a so-called wafer level chip size package (WL-CSP), and the TSV formed on the sensor chip 101 electrically couples the circuit part in the sensor chip 101 to a rewiring layer 104 and an external terminal 105 that are formed on side of a surface S102. This package configuration makes it possible to realize downsizing.

In the sensor chip package 100a of the foregoing Comparative Example 1, however, a space for arrangement of the external terminals 105 is small and the freedom of arrangement of the external terminals 105 is low. Moreover, it is difficult to increase the number of the external terminals 105 and cope with further sophistication of the sensor chip 101.

In addition, FIG. 12 illustrates a cross-sectional configuration of a sensor chip package 100b according to the comparative example (Comparative Example 2) of embodiment. The sensor chip package 100b of Comparative Example 2 includes the light receiving part 101A on the surface S101 of the sensor chip 101, and has a substrate 106 facing the sensor chip 101 via the cavity 101l. The substrate 106 is so provided as to protrude in a peripheral region 106a of the sensor chip 101 and an external terminal 109 is formed in the peripheral region 106a of the substrate 106. A sealing layer 107 is formed in the peripheral region of the cavity 101l. An electrode part 108 electrically coupled to the circuit part is formed on the surface S101 of the sensor chip 101.

The sensor chip package 100b of Comparative Example 2 is a so-called Fan-out type CSP, and the electrode part 108 on the surface S101 of the sensor chip 101 is withdrawn to the peripheral region 106a of the substrate 106 and electrically coupled to the external terminal 109. This package configuration makes it possible to arrange the external terminal 109 in the peripheral region of the sensor chip 101 and increase the number of the external terminals 109 as compared with the configuration of the foregoing Comparative Example 1.

In the sensor chip package 100b of Comparative Example 2, however, the package size easily becomes large. Moreover, a region where the external terminal 109 is allowed to be arranged is limited to the peripheral region 106a of the substrate 106. For this reason, there is room for improvement of the freedom of arrangement and the number of terminals that are allowed to be arranged, of the external terminals 109.

In contrast to this, in the sensor chip package 1 of this embodiment, it is possible to arrange the external terminal 17 in both the region corresponding to the sensor chip 10 and the region corresponding to the resin layer 13 (peripheral region of the sensor chip 10), as described above. Therefore, as compared with the sensor chip package 100a of the foregoing Comparative Example 1, the freedom of arrangement of the external terminals 17 improves. Moreover, it is possible to increase the number of the external terminals that are allowed to be arranged.

In addition, in the sensor chip package 1 of this embodiment, it is possible to make the package size smaller than the sensor chip package 100b of the foregoing Comparative Example 2. In addition, the freedom of arrangement of the external terminals 17 improves and it is also possible to increase the number of the external terminals that are allowed to be arranged. Therefore, it is possible to improve the freedom of arrangement of the external terminals 17, while realizing downsizing.

Besides, in this embodiment, as described above, the improved freedom of arrangement of the external terminals 17 makes it easy to design a layout that makes the wiring route shorter. Shortening of the wiring route allows less susceptibility to parasitic capacitance, for example. In addition, the increased number of the external terminals that are allowed to be arranged makes it possible to cope with the further sophistication of the sensor chip 10 as well.

As described above, in the sensor chip package 1 of this embodiment, the resin layer 13 is formed in the periphery of the sensor chip 10, and the electrode 10e on the surface S11 of the sensor chip 10 is electrically coupled to the external terminal 17 formed on the side of the surface S12. This allows for the formation of the external terminal 17 in both the region corresponding to the sensor chip 10 and the region corresponding to the resin layer 13, on the side of the surface S12 of the sensor chip 10. It is possible to make the package size smaller than the package structure in which the external terminal is arranged only in the region corresponding to the plurality of the sensor chip. Moreover, the freedom of arrangement of the external terminals becomes higher than the package structure in which the external terminal is arranged only in the region corresponding to the semiconductor chip (a region located inside more than a perimeter of the semiconductor chip). Thus, it is possible to improve the freedom of arrangement of the external terminals, while realizing downsizing.

In the following, other embodiments and a modification example of the present disclosure are described. It is to be noted that components similar to the foregoing first embodiment are assigned with identical symbols, a description of which is omitted, when necessary.

Second Embodiment

[Configuration]

FIG. 13 illustrates a cross-sectional configuration of a semiconductor chip package (sensor chip package 2) of a second embodiment of the present disclosure. Similarly to the sensor chip package 1 of the foregoing first embodiment, the sensor chip package 2 is the electronic component such as the chip size package (CSP) or the wafer level package (WLP), for example, and includes a sensor chip 20 (semiconductor chip), for example. A resin layer 22 is formed in a periphery of the sensor chip 20 (the periphery of the sensor chip 20 is sealed by the resin layer 22). The substrate 12 is disposed to face the surface S11 of the sensor chip 20 and the resin layer 22. The rewiring layer 16 and the plurality of external terminals 17 are provided on side of the surface S12 of the sensor chip 20.

Similarly to the sensor chip 10 of the foregoing first embodiment, the sensor chip 20 includes the imaging device (light receiving device) such as the CCD and the CMOS image sensor, for example. In addition, in the sensor chip 20, the circuit part including the transistor is formed on the silicon substrate, for example, by the microfabrication process, and the various functions are integrated. The light receiving part 10A is formed on the surface S11 of the sensor chip 20. The plurality of electrodes (electrodes 20e described later) for supplying the voltage to the aforementioned circuit part are formed on the sensor chip 20. It is to be noted that, although the electrode 20e is not particularly illustrated, the electrode 20e of this embodiment may be formed on the surface S11 of the sensor chip 20 or formed within the sensor chip 20.

The gap (cavity 21) is provided between the surface S11 of the sensor chip 20 and the substrate 12. In other words, the sensor chip 20 and the substrate 12 are spaced apart and disposed to face each other. A thickness t2 of the cavity 21 (distance between the surface S11 of the sensor chip 20 and the substrate 12) is not particularly limited, but it is desirable that size be secured that does not damage the light receiving part 10A (on-chip lens, in particular) of the sensor chip 20. In this embodiment, the substrate 12 is bonded to the resin layer 22 via an adhesion layer 22a.

It is possible that the resin layer 22 include the thermosetting resin similar to the resin layer 13 of the foregoing first embodiment. Although the width d of the resin layer 22 is not particularly limited, the width d is appropriately set in accordance with the size of the sensor chip package 2 and the layout of the external terminal 17, for example. The resin layer 22 is so formed in the periphery of the sensor chip 20 as to have the same thickness (thickness t) as the sensor chip 20. It is desirable that a surface of the resin layer 22 opposite to the substrate 12 and the surface S12 of the sensor chip 20 make a single plane (be flat), for example.

The adhesion layer 22a adheres the resin layer 22 and the substrate 12, and serves as a spacer for forming the cavity 21. For the adhesion layer 22a is used the resin material that serves as a so-called dam material, for example.

In the sensor chip package 2 as described above, the substrate 12 is disposed to face the surface S11 of the sensor chip 20 and the resin layer 22 is formed in the periphery of the sensor chip 20. In such a configuration, the electrode 20e of the sensor chip 20 and the external terminal 17 on the side of the surface S12 are electrically coupled. In the following, an example of the wiring route for electrically coupling them is described.

(Wiring Connection Configuration)

FIG. 14 illustrates an example of the wiring connection configuration (wiring route) between the sensor chip 20 (electrode 20e, in particular) and the external terminal 17. It is to be noted that FIG. 14 assumes the planar configuration of a case where the sensor chip package 2 is viewed from the side of the surface S2. In this embodiment, a through-electrode 24 is formed on the sensor chip 20, as illustrated in FIG. 13 and FIG. 14. With this configuration, the electrode 20e of the sensor chip 20 and the external terminal 17 are electrically coupled through, for example, the through-electrode 24 and the rewiring layer 16 (rewiring 16a). In this example, the external terminal 17 is arranged both in the region corresponding to the sensor chip 20 and the region corresponding to the resin layer 22 (peripheral region of the sensor chip 20).

The through-electrode 24 is the through-silicon electrode (TSV) that is formed by penetrating at least a portion of the sensor chip 20 (silicon substrate of the sensor chip 20, for example). For example, the plurality of through-electrodes 24 are provided in the sensor chip 20. One end of the through-electrode 24 is electrically coupled to the one or two or more electrodes 20e of the sensor chip 20. Other end of the through-electrode 24 is electrically coupled to any external terminal 17 of the plurality of external terminals 17. It is possible to form the through-electrode 24 by embedding copper (Cu), for example, into the through-hole (through-hole) formed in the sensor chip 20, for example, by plating.

It is to be noted that, similarly to the foregoing first embodiment, this embodiment is not limited to the configuration in which the one electrode 20e as illustrated in FIG.

14 is coupled to the one external terminal 17 via the one through-electrode 24, the two or more electrodes 20e may be coupled to the one through-electrode 24. Moreover, the two or more through-electrodes 24 may be coupled to the one external terminal 17. As described in the foregoing first embodiment, this makes it possible to reduce the number of the through-electrodes 24 and the number of the external terminals 17 without changing the functions integrated in the sensor chip 20, and to cope with the further multifunctionality.

[Manufacturing Method]

It is possible to manufacture the sensor chip package 2 as described above, in the following manner, for example. FIG. 15 to FIG. 22 sequentially illustrate manufacturing processes of the sensor chip package 2. It is to be noted that, in FIG. 15 to FIG. 22, illustration of some components of the components illustrated in FIG. 13 is omitted for simplicity.

First, as illustrated in FIG. 15, the sensor chip 20 in which the through-electrode 24 is formed is bonded to a support substrate 210 via an adhesion layer 211 having strippability. At this time, the side of the surface S11 of the sensor chip 20 is adhered to the support substrate 210.

Thereafter, the resin layer 22 is formed, as illustrated in FIG. 16A. Specifically, the thermosetting resin including the aforementioned material is so applied and thermally set as to cover the surface of each of the sensor chips 20 and fill a region between the sensor chips 20 themselves. Afterward, as illustrated in FIG. 16B, a surface of the formed resin layer 22 is polished to expose the surface S12 of the sensor chip 20. This allows for the formation of the resin layer 22 in the periphery of the sensor chip 20. Moreover, it is possible to planarize the surface of the resin layer 22 opposite to the substrate 12 and the surface S12 of the sensor chip 20 to cause them to make a single plane.

Next, the rewiring layer 16 is formed, as illustrated in FIG. 17. Specifically, the rewiring 16a is formed on the surface S12 of the sensor chip 20, similarly to the foregoing first embodiment, following which the solder resist 16b having an opening h2 is formed.

Afterward, the support substrate 210 is stripped from the surface S11 of the sensor chip 20, as illustrated in FIG. 18. At this time, a support substrate 213 is bonded onto the rewiring layer 16 via an adhesion layer 212 having the strippability. That is, a support surface is switched between the bottom and the top of the sensor chip 20.

Thereafter, the substrate 12 is bonded onto the surface S11 of the sensor chip 20 via the adhesion layer 22a, as illustrated in FIG. 19. This forms the cavity 21 between the sensor chip 20 and the substrate 12, making it possible to protect the light receiving part 10A (not illustrated in FIG. 19) of the sensor chip 20. It is to be noted that in FIG. 19, the configuration of FIG. 18 is flipped vertical and illustrated.

Next, the support substrate 213 is stripped from the rewiring layer 16, as illustrated in FIG. 20.

Afterward, as illustrated in FIG. 21, the external terminal 17 such as a solder bump, for example, is formed at the opening h2 of the rewiring layer 16 (solder resist 16b).

Lastly, separation (dicing) is performed, as illustrated in FIG. 22. This completes the sensor chip package 2 illustrated in FIG. 13.

[Workings and Effects]

In the sensor package 2 of this embodiment, the resin layer 22 is formed in the periphery of the sensor chip 20, and the electrode 20e of the sensor chip 20 is electrically coupled to the external terminal 17 formed on the side of the surface S12. Specifically, the electrode 20e and the external terminal 17 are coupled through the through-electrode 24 formed on the sensor chip 20. Similarly to the foregoing first embodiment, this allows for the formation of the external terminal 17 in both the region corresponding to the sensor chip 20 and the region corresponding to the resin layer 22, on the side of the surface S12 of the sensor chip 20 (side of the surface S2 of the sensor chip package 2).

Therefore, also in this embodiment, it is possible to make the package size smaller than the package structure in which the external terminal is arranged only in the region corresponding to the periphery of the sensor chip. Moreover, the freedom of arrangement of the external terminals increases as compared with the package structure in which the external terminal is arranged only in the region corresponding to the semiconductor chip (a region located inside more than the perimeter of the semiconductor chip). Thus, it is possible to improve the freedom of arrangement of the external terminals 17 while realizing downsizing.

Modification Example

FIG. 23 illustrates an example of the wiring connection configuration (wiring route) between the sensor chip 20 of the sensor chip package and the external terminal 17 according to the modification example. In the foregoing first embodiment, the through-electrode 14 formed in the resin layer 13 is used to electrically couple the electrode 10e and the external terminal 17. In the foregoing second embodiment, the through-electrode 24 formed on the sensor chip 20 is used to electrically couple the electrode 20e and the external terminal 17. However, the wiring connection configuration of the present disclosure is not limited to these examples. For example, as in this modification example, the through-electrode 14 of the foregoing first embodiment and the through-electrode 24 of the foregoing second embodiment may be both used.

In this modification example, the electrode 10e is provided on the surface S11 of the sensor chip 20, and the wiring part 18 (coupling part 18a, wiring layer 18b) is electrically coupled to the electrode 10e and provided thereon. In addition, the sensor chip 20 has the electrode 20e coupled to the circuit part. The electrode 10e is electrically coupled to the external terminal 17 via the wiring part 18, the through-electrode 14, and the rewiring 16a. The electrode 20e is electrically coupled to the external terminal 17 through the through-electrode 24 and the rewiring 16a.

As in this modification example, a combination of the through-electrode 14 as the TMV and the through-electrode 24 as the TSV may be used. Also in this case, it is possible to obtain effects equivalent to the foregoing first and second embodiments. Moreover, it is possible to configure the wiring route by using the through-electrode 24 in the region corresponding to the sensor chip 20 and the through-electrode 14 in the peripheral region of the sensor chip 20, respectively. Hence, the freedom of arrangement of the external terminals 17 and the rewiring 16a is further improved on the surface S2. Moreover, this makes it possible to cope with the further sophistication and makes it easy to design a shorter wiring route, which is also advantageous in reduction in the parasitic capacitance.

As described above, a description has been given with reference to the embodiments and modification example. However, the present disclosure is not limited to the embodiments described in the foregoing embodiments, etc., and various variations are possible. For example, in the foregoing embodiments, etc., as the semiconductor chip and the semiconductor chip package, the sensor chips 10, 20 having the imaging device and the sensor chip packages 1, 2 are exemplarily illustrated. However, the semiconductor chip and the semiconductor chip package are not limited thereto, and a semiconductor chip and a semiconductor chip package that do not have the imaging device (light receiving device) may be applied.

In addition, the layout of the electrodes 10e, 20e, the through-electrodes 14, 24, the rewiring 16a, and the external terminal 17 is merely an example, but not limited to the foregoing, and may take various forms. Moreover, the effects that have been described in the foregoing embodiments are merely an example, and the effects of the present disclosure may be other effects and may further include other effects.

It is to be noted that the present disclosure may have the following configurations.

(1)

A semiconductor chip package including:

a semiconductor chip that has opposed first surface and second surface, and has a circuit part and a plurality of electrodes for supplying a voltage to the circuit part;

a resin layer formed in a periphery of the semiconductor chip; and a substrate that is disposed to face the first surface of the semiconductor chip and the resin layer, and has optical transparency; and a plurality of external terminals provided on side of the second surface of the semiconductor chip, each of the plurality of external terminals being electrically coupled to any of the plurality of electrodes.

(2)

The semiconductor chip package according to (1), in which the electrode is provided on the first surface of the semiconductor chip, the semiconductor chip package further including:

a wiring part provided on side of the first surface of the semiconductor chip and electrically coupled to the electrode; and a first through-electrode formed by penetrating the resin layer, one end of the first through-electrode being electrically coupled to the wiring part and the other end being electrically coupled to any external terminal of the plurality of external terminals.

(3)

The semiconductor chip package according to (2), in which the wiring part includes:

a coupling part electrically coupled to the electrode of the semiconductor chip; and a wiring layer provided between the substrate and the resin layer, one portion of the wiring layer being electrically coupled to the coupling part and the other portion being electrically coupled to the first through-electrode.

(4)

The semiconductor chip package according to any one of (1) to (3), in which the resin layer includes:

a first resin layer that covers a portion or all of a side surface of the semiconductor chip; and a second resin layer that covers the first resin layer to seal the periphery of the semiconductor chip.

(5)

The semiconductor chip package according to any one of (1) to (4), further including:

a second through-electrode formed by penetrating at least a portion of the semiconductor chip, one end of the second through-electrode being electrically coupled to the electrode, and the other end being electrically coupled to any external terminal of the plurality of external terminals.

(6)

The semiconductor chip package according to (1), in which the resin layer is formed in the periphery of the semiconductor chip in a same thickness as the semiconductor chip.

(7)

The semiconductor chip package according to (1), further including:

a wiring part formed on side of the first surface of the semiconductor chip and electrically coupled to the electrode;

a first through-electrode formed by penetrating the resin layer, one end of the first through-electrode being electrically coupled to the wiring part and the other end being electrically coupled to any external terminal of the plurality of external terminals; and a second through-electrode formed by penetrating at least a portion of the semiconductor chip, one end of the second through-electrode being electrically coupled to the electrode and the other end of the second through-electrode being electrically coupled to any external terminal of the plurality of external terminals.

(8)

The semiconductor chip package according to any one of (1) to (7), in which the second surface of the semiconductor chip and a surface of the resin layer opposite to the substrate make a single plane, and the plurality of external terminals are provided across the plane.

(9)

The semiconductor chip package according to any one of (1) to (8), in which the substrate is a glass substrate.

(10)

The semiconductor chip package according to any one of (1) to (9), including a gap between the substrate and the semiconductor chip.

(11)

The semiconductor chip package according to any one of (1) to (10), in which the semiconductor chip includes an imaging device.

This application is based upon and claims priority from Japanese Patent Application No. 2016-121316 filed with the Japan Patent Office on Jun. 20, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor chip package, comprising:
a semiconductor chip that comprises:
a first surface and a second surface opposed to the first surface;
a circuit part; and
a plurality of electrodes configured to supply a voltage to the circuit part;
a resin layer in a periphery of the semiconductor chip;
a substrate that faces the first surface of the semiconductor chip and the resin layer, wherein the substrate has optical transparency;
a rewiring layer on a side of the second surface of the semiconductor chip, wherein the rewiring layer is across an entire region of the second surface; and
a plurality of external terminals on the side of the second surface of the semiconductor chip, wherein each external terminal of the plurality of external terminals is electrically coupled to one electrode of the plurality of electrodes through the rewiring layer.

2. The semiconductor chip package according to claim 1, wherein
the plurality of electrodes is on the first surface of the semiconductor chip,
the semiconductor chip package further comprises:
a wiring part on a side of the first surface of the semiconductor chip, wherein the wiring part is electrically coupled to the one electrode of the plurality of electrodes; and
a first through-electrode that penetrates the resin layer, wherein
a first end of the first through-electrode is electrically coupled to the wiring part, and
a second end of the first through-electrode is electrically coupled to at least one external terminal of the plurality of external terminals through the rewiring layer.

3. The semiconductor chip package according to claim 2, wherein the wiring part comprises:
a coupling part electrically coupled to the one electrode of the plurality of electrodes of the semiconductor chip; and
a wiring layer between the substrate and the resin layer, wherein a first portion of the wiring layer is electrically coupled to the coupling part and a second portion is electrically coupled to the first through-electrode.

4. The semiconductor chip package according to claim 1, wherein the resin layer comprises:
a first resin layer that covers at least a portion of a side surface of the semiconductor chip; and
a second resin layer that covers the first resin layer to seal the periphery of the semiconductor chip.

5. The semiconductor chip package according to claim 1, further comprising
a second through-electrode that penetrates at least a portion of the semiconductor chip, wherein a first end of the second through-electrode is electrically coupled to the one electrode of the plurality of electrodes, and a second end of the second through-electrode is electrically coupled to at least one external terminal of the plurality of external terminals.

6. The semiconductor chip package according to claim 1, wherein a thickness of the resin layer is equal to a thickness of the semiconductor chip.

7. The semiconductor chip package according to claim 1, further comprising:
a wiring part on a side of the first surface of the semiconductor chip, wherein the wiring part is electrically coupled to the one electrode of the plurality of electrodes;
a first through-electrode that penetrates the resin layer, wherein
a first end of the first through-electrode is electrically coupled to the wiring part, and
a second end of the first through-electrode is electrically coupled to at least one external terminal of the plurality of external terminals through the rewiring layer; and
a second through-electrode that penetrates at least a portion of the semiconductor chip, wherein a first end of the second through-electrode is electrically coupled to the one electrode of the plurality of electrodes, and a second end of the second through-electrode is electrically coupled to the at least one external terminal of the plurality of external terminals.

8. The semiconductor chip package according to claim 1, wherein
the second surface of the semiconductor chip and a surface of the resin layer opposite to the substrate make a single plane, and
the plurality of external terminals is across the single plane.

9. The semiconductor chip package according to claim 1, wherein the substrate is a glass substrate.

10. The semiconductor chip package according to claim 1, wherein a gap is formed between the substrate and the semiconductor chip.

11. The semiconductor chip package according to claim 1, wherein the semiconductor chip includes an imaging device.

12. The semiconductor chip package according to claim 1, wherein
the rewiring layer comprises a solder resist having an opening, and
one external terminal of the plurality of external terminals is at the opening.

* * * * *